United States Patent
Nauditt

(10) Patent No.: US 11,910,494 B2
(45) Date of Patent: Feb. 20, 2024

(54) HIGH-TEMPERATURE COMPONENT AND METHOD FOR THE PRODUCTION THEREOF

(71) Applicant: SCHUNK KOHLENSTOFFTECHNIK GMBH, Heuchelheim (DE)

(72) Inventor: Gotthard Nauditt, Huettenberg (DE)

(73) Assignee: SCHUNK KOHLENSTOFFTECHNIK GMBH, Heuchelheim (DE)

( * ) Notice: Subject to any disclaimer, the term of this patent is extended or adjusted under 35 U.S.C. 154(b) by 660 days.

(21) Appl. No.: 16/648,927

(22) PCT Filed: Sep. 12, 2018

(86) PCT No.: PCT/EP2018/074557
§ 371 (c)(1),
(2) Date: Mar. 19, 2020

(87) PCT Pub. No.: WO2019/063285
PCT Pub. Date: Apr. 4, 2019

(65) Prior Publication Data
US 2020/0253001 A1 Aug. 6, 2020

(30) Foreign Application Priority Data

Sep. 26, 2017 (DE) ...................... 10 2017 217 122.7

(51) Int. Cl.
*B29C 64/118* (2017.01)
*B33Y 10/00* (2015.01)
(Continued)

(52) U.S. Cl.
CPC .............. *H05B 3/145* (2013.01); *B33Y 10/00* (2014.12); *B33Y 40/20* (2020.01); *B33Y 80/00* (2014.12);
(Continued)

(58) Field of Classification Search
CPC ......... B33Y 10/00; B33Y 40/20; B33Y 80/00; C04B 41/5059; C04B 35/78; C04B 35/66;
(Continued)

(56) References Cited

U.S. PATENT DOCUMENTS 4,195,049 A * 3/1980 Noakes ................. C04B 35/573
264/29.7
9,402,322 B1 * 7/2016 Findley ................. H05K 1/0306
(Continued)

FOREIGN PATENT DOCUMENTS

EP 2520839 A2 11/2012

OTHER PUBLICATIONS

PCT International Search Report and Written Opinion, PCT/EP2018/074557, dated Jan. 7, 2019, 22 pages.

*Primary Examiner* — Eric S Stapleton
(74) *Attorney, Agent, or Firm* — Quarles & Brady LLP

(57) ABSTRACT

A method for producing a high-temperature includes forming a dimensionally stable green body of the high-temperature component from a matrix material and pyrolizing the matrix material. A material mixture of the matrix material with a carbon material is used to form the high-temperature component, and a thermoplastic is used as the matrix material. The green body is formed by additive manufacturing.

13 Claims, 1 Drawing Sheet

(51) Int. Cl.
*B33Y 40/20* (2020.01)
*B33Y 80/00* (2015.01)
*C04B 35/66* (2006.01)
*C04B 35/78* (2006.01)
*C04B 41/00* (2006.01)
*C04B 41/45* (2006.01)
*C04B 41/50* (2006.01)
*C04B 41/87* (2006.01)
*H05B 3/08* (2006.01)
*H05B 3/14* (2006.01)
*H05B 3/46* (2006.01)
*C23C 16/32* (2006.01)

(52) U.S. Cl.
CPC .............. *C04B 35/66* (2013.01); *C04B 35/78* (2013.01); *C04B 41/009* (2013.01); *C04B 41/4531* (2013.01); *C04B 41/5059* (2013.01); *C04B 41/87* (2013.01); *H05B 3/08* (2013.01); *H05B 3/46* (2013.01); *B29C 64/118* (2017.08); *C04B 2235/3826* (2013.01); *C04B 2235/422* (2013.01); *C04B 2235/48* (2013.01); *C04B 2235/6026* (2013.01); *C23C 16/325* (2013.01); *H05B 2203/002* (2013.01); *H05B 2203/017* (2013.01); *H05B 2214/04* (2013.01)

(58) Field of Classification Search
CPC ... C04B 41/009; C04B 41/87; C04B 41/4531; C04B 2235/6026; C04B 2235/3826; C04B 2235/48; C04B 2235/422; H05B 3/286; H05B 3/08; H05B 3/145; H05B 3/46; H05B 3/48; H05B 2203/017; H05B 2203/002; H05B 2214/04; C23C 16/325; B29C 64/118
USPC ........................................................ 219/541
See application file for complete search history.

(56) References Cited

U.S. PATENT DOCUMENTS

| | | | | |
|---|---|---|---|---|
| 9,862,606 B1* | 1/2018 | Cook | ................... | C01B 32/152 |
| 9,997,334 B1* | 6/2018 | Anzelmo | ................. | C01B 32/00 |
| 2004/0003738 A1* | 1/2004 | Imiolek | ................... | B22F 12/10 |
| | | | | 101/480 |
| 2007/0065676 A1* | 3/2007 | Bacalski | ................. | B32B 18/00 |
| | | | | 428/688 |
| 2011/0174803 A1* | 7/2011 | Ihle | ........................ | H05B 3/141 |
| | | | | 219/553 |
| 2012/0308837 A1* | 12/2012 | Schlechtriemen | .... | C04B 35/119 |
| | | | | 264/610 |
| 2014/0117575 A1* | 5/2014 | Kemperle | ............ | B29C 64/106 |
| | | | | 264/40.7 |
| 2014/0141244 A1* | 5/2014 | Huang | ................... | C09K 21/02 |
| | | | | 428/389 |
| 2014/0191166 A1* | 7/2014 | Wang | ....................... | H01B 1/24 |
| | | | | 423/447.2 |
| 2014/0238974 A1* | 8/2014 | Nauditt | ................. | C04B 35/573 |
| | | | | 219/534 |
| 2014/0262107 A1* | 9/2014 | Hanrahan | ............. | B33Y 80/00 |
| | | | | 164/349 |
| 2014/0262108 A1* | 9/2014 | Hanrahan | ................. | B22C 7/02 |
| | | | | 164/45 |
| 2014/0262115 A1* | 9/2014 | Hanrahan | ................. | B22C 9/04 |
| | | | | 164/244 |
| 2014/0328963 A1* | 11/2014 | Mark | ..................... | B33Y 50/02 |
| | | | | 425/143 |
| 2015/0096713 A1* | 4/2015 | Marcin | ............. | B22D 17/2209 |
| | | | | 164/520 |
| 2015/0125342 A1* | 5/2015 | Abraham | .................. | A61L 2/03 |
| | | | | 422/186.05 |
| 2015/0301281 A1* | 10/2015 | Findley | ................... | B28B 1/001 |
| | | | | 264/1.24 |
| 2015/0305158 A1* | 10/2015 | Findley | ................... | B32B 18/00 |
| | | | | 264/105 |
| 2015/0354392 A1* | 12/2015 | Lipkin | .................. | F01D 11/125 |
| | | | | 415/173.4 |
| 2015/0354393 A1* | 12/2015 | Lipkin | .................. | F01D 11/122 |
| | | | | 427/552 |
| 2015/0354394 A1* | 12/2015 | Leblanc, I | ................ | C23C 4/12 |
| | | | | 416/189 |
| 2015/0367375 A1* | 12/2015 | Page | ....................... | B29C 64/10 |
| | | | | 118/697 |
| 2016/0052829 A1* | 2/2016 | Schoenfeld | ........... | C04B 35/573 |
| | | | | 428/408 |
| 2016/0320149 A1* | 11/2016 | Poltorak | .................... | F28F 3/02 |
| 2017/0259502 A1* | 9/2017 | Chapiro | .................. | B33Y 10/00 |
| 2018/0154437 A1* | 6/2018 | Mark | ....................... | B22F 10/10 |
| 2018/0154580 A1* | 6/2018 | Mark | ....................... | B22F 5/10 |
| 2018/0162062 A1* | 6/2018 | Mark | ....................... | B22F 10/43 |
| 2019/0299522 A1* | 10/2019 | Chapiro | .................. | B29C 70/38 |
| 2020/0308064 A1* | 10/2020 | Fisher | .................. | C04B 35/5615 |

\* cited by examiner ized in order to set a resistance of the resistance heating element. In this case, too, the green body consisting of the powder mixture with a binding agent or resin is highly fragile, and additional process steps are required after pyrolysis, such as infiltration of the resistance heating element with carbon.

Hence, the object of the present disclosure is to propose a method for producing a high-temperature component and a resistance heating element that allows for efficient production.

In the method for producing a high-temperature component, in particular a resistance heating element or the like, a dimensionally stable green body of the high-temperature component is formed from a matrix material, the green body being turned into the high-temperature component by pyrolizing the matrix material, a material mixture of the matrix material with a carbon material being used to form the high-temperature component, wherein a thermoplastic is used as the matrix material, the green body being formed by additive manufacturing.

With this method, a high-temperature component of basically any shape can be realized. A high-temperature component in this context is a component that can be used at a temperature in a range of 300° C. to 3,000° C. By using a thermoplastic instead of a powder mixture with a resin or the like when producing the green body layer by layer, tight adhesion between the individual layers can be ensured particularly well, whereby a particularly stable green body is obtained. This green body is easy to handle without having to fear easy fracturing of the green body. Furthermore, a large portion of the thermoplastic can be converted into carbon during subsequent pyrolysis of the green body in a furnace. Together with the carbon material which has been added to the thermoplastic, a high-temperature component that has low porosity and thus a high carbon content can be obtained. A comparatively high filling of the thermoplastic with the carbon material results in low electrical resistance and in reduced shrinkage and thus in improved stability of the high-temperature component during pyrolysis. Overall, a number of potential scrap parts from producing the high-temperature component can be lowered significantly in this way.

It is particularly advantageous if the high-temperature component is formed in one piece. This makes assembly of multiple components into the high-temperature component unnecessary and the high-temperature component all in all becomes simpler to produce. If the high-temperature component is formed in one piece, the green body can be formed in one piece as well.

Advantageously, the high-temperature component produced is a resistance heating element, in which case the resistance heating element can be realized with a heating conductor. The heating conductor of the resistance heating element, which can make up the entire resistance heating element, can be constructed layer by layer from the thermoplastic, to which a carbon material has been added, by additive manufacturing and can thus be realized in its shape. Together with the carbon material that has been added to the thermoplastic, a heating conductor having low porosity and thus a high carbon content can be obtained. With the method, a resistance heating element of basically any shape can be realized. However, the method is particularly suitable for realizing resistance heating elements of complex geometry and flat or plane resistance heating elements having comparatively delicate heating conductors because these resistance heating elements might be easily destroyed in the production methods known from the state of the art.

The resistance heating element can be realized with an electrically nonconductive conductor support accommodating the heater. The conductor support can have dielectric or semi-conductive properties (>10$^4$ S/cm). Since the conductor support can accommodate the heating conductor, the heating conductor can be disposed on or embedded in the conductor support or be enclosed by the conductor support on all sides. This is made possible in the first place by the fact that the green body is formed by additive manufacturing. This allows the heating conductor to be particularly delicate because the heating conductor can be supported by the conductor support in this case. Although the conductor support is essentially non-conductive or semi-conductive, no air gaps have to be formed in the material of the green body or of the resistance heating element, rendering mechanical processing, which is often the cause for fracturing of the green body or of the resistance heating element, unnecessary. Also, the absence of air gaps between heating conductor paths allows a more homogenous design and thus improvement of the temperature distribution or glow distribution of the resistance heating element. The conductor support can have minimal electrical conductivity, thus avoiding a flow of current between conductor paths of the heating conductor. In principle, however, an air gap can still be formed between conductor paths of the heating conductor if this appears to be advantageous.

Another material mixture of the matrix material with a silicon material can be used to form the conductor support. This makes it possible to connect the material mixture together with the other material mixture to each other in an easy and stable manner by additive manufacturing because of the identical matrix material. If the green body is constructed layer by layer, the green body consists entirely of the matrix material, the carbon material and the silicon material being discharged as a function of the production of the heating conductor and of the conductor support during layer-by-layer construction.

The green body can be realized with the material mixture embedded in the other material mixture. Accordingly, the heating conductor can essentially be disposed within the conductor support. The conductor support entirely surrounds the heating conductor in that case, whereby the heating conductor can be protected against oxidation and mechanical damage. Terminal pads of the heating conductor for connecting the resistance heating element can be formed on the resistance heating element, said terminal pads protruding from the conductor support or not being covered by the conductor support. The application of the additive manufacturing technique is what makes it possible for the material mixture to be embedded in the other material mixture.

The other material mixture can be used with a stoichiometric mixture of matrix material and silicon material, in which case silicon carbide can be formed from the other material mixture during pyrolysis. Since the matrix material is a thermoplastic which is converted into carbon during pyrolysis, silicon carbide can be formed during pyrolysis by means of the mixture with the silicon material. The stoichiometric mixture of matrix material and silicon material is used in order to avoid an excess of free silicon or carbon in the conductor support. To form silicon carbide, a carbon-to-silicon mass ratio of 1:2.33 is required. The amount of carbon obtainable by pyrolyzing the thermoplastic has to be taken into account. Hence, the stoichiometric mixture always depends on the matrix material selected. If pure silicon carbide can be formed, a particularly clear separation of the heating conductor and the conductor support is possible. Moreover, low electrical conductivity of the conductor support is realized and diffusion of free silicon out of the conductor support can be avoided.

Thus, the material mixture of the heating conductor can be converted into carbon and the other material mixture of the conductor support can be converted into silicon carbide by means of the pyrolysis. Also, high density of the resistance heating element at simultaneously low porosity can be achieved by filling the matrix material or thermoplastic with carbon material or silicon material. Silicon fibers or silicon particles can be used as the silicon material, for example. The green body can be provided with very high stability simply by using silicon fibers. Also, the silicon fibers help avoid potential fractures in the green body or resistance heating element in subsequent process steps.

Carbon fibers, carbon black, graphite, graphene and/or carbon nanotubes can be used as the carbon material. In particular by exclusively using or partially admixing graphene, a conductivity of the heating conductor can be significantly improved compared to instances when graphite is used. Furthermore, a high carbon content in the thermoplastic leads to reduced shrinkage of the heating conductor during pyrolysis. Aside from carbon fibers, however, other organic fibers that can be converted into carbon by pyrolysis can be used, as well. Also, the carbon fibers improve the strength of the green body or high-temperature component or resistance heating element.

The fibers can preferably be short cut fibers and can be discharged from a nozzle together with the matrix material and be spatially arranged. If the fibers are extruded from the nozzle together with the matrix material or thermoplastic, the green body can be formed without the aid of a mold. The fibers are placed from the nozzle layer by layer together with the thermoplastic on the basis of a data model of a shape of the green body or of a heating conductor and of a conductor support. This can take place by means of one nozzle for the material mixture and another nozzle for the other material mixture. The nozzle is moved along the shape of the green body during extrusion, generatively producing the green body by applying the fibers with the thermoplastic. This makes it possible for a fiber composite component or green body of almost any shape to be formed. Use of a mold for forming the shape is no longer required, which makes production of the green body more cost-efficient overall. The fibers can have a diameter of 5 μm to 30 μm, preferably of 10 μm. Fibers of these diameters are particularly suitable for extrusion from the nozzle together with the thermoplastic.

It is particularly advantageous if the high-temperature component or resistance heating element can be realized with a fiber content of 10 vol % to 60 vol %, preferably of up to 35 vol %. A high fiber content is favorable to the strength of the green body and of the resistance heating element.

The green body can be produced by fused deposition modeling (FDM). In fused deposition modeling, a 3D printer applies a pattern of dots to a surface. A wire-shaped thermoplastic is fed to the 3D printer, heated, and extruded through a nozzle, the thermoplastic subsequently hardening in the desired position by cooling. The green body is then constructed by the nozzle moving along the respective layers line by line, a shape of the green body being generated layer by layer. A layer thickness can be between 0.025 mm and 1.25 mm.

Polyetherimide (PEI), polyether ether ketone (PEEK), polysulfone (PSU) or polyphenylene sulfone (PPSU) can be used as the matrix material. These plastics are suitable for being used in additive manufacturing, and a high carbon content can be obtained by pyrolyzing these plastics, such as 55 m % of carbon with PEI and 50 m % of carbon with PEEK.

After pyrolysis, the high-temperature component or resistance heating element can be CVD-coated with silicon carbide. This prevents free silicon from escaping during operation of a resistance heating element. In CVD (chemical vapor deposition) coating, a silicon carbide layer is deposited on the high-temperature component or resistance heating element at 700° C. to 1,500° C., for example. The silicon carbide layer surrounds essentially the entire high-temperature component or resistance heating element, precluding any silicon trapped in the material of the high-temperature component or resistance heating element from escaping.

After pyrolysis, high-temperature treatment of the high-temperature component or resistance heating element can be performed. The pyrolysis can be carried out in a range of 280° C. to 1,200° C. in temperature, and the high-temperature treatment can be carried out in a range of 1,200° C. to 2,400° C. in temperature. The high-temperature treatment can serve to deplete oxygen and nitrogen in the high-temperature component or resistance heating element and can be carried out in a vacuum or inert gas.

The resistance heating element according to the disclosure is formed in one piece, the resistance heating element being realized with a heating conductor made of carbon, the resistance heating element being realized with an electrically non-conductive conductor support made of silicon carbide and accommodating the heating conductor. A non-conductive conductor support in this context is a conductor support having an electrical conductivity of at least $>10^4$ S/cm. The heating conductor made of carbon is mechanically stabilized by the conductor support in particular because the conductor support made of silicon carbide accommodates the heating conductor made of carbon. Hence, the heating conductor can be comparatively thin and can have almost any shape, said shape no longer being limited to a shape that takes the strength of the heating conductor into account. The resistance heating element can be produced in particular by means of the method according to the disclosure. Regarding other advantageous features of the resistance heating element, reference is made to the description of advantages of the method according to the disclosure.

The resistance heating element can be realized with a concentration gradient between the carbon of the heating conductor and the silicon carbide of the conductor support. Accordingly, there is a zone between the heating conductor and the conductor support that contains both carbon and silicon carbide. This zone is a result of diffusion of the material of the heating conductor into the material of the conductor support and vice-versa during pyrolysis. It is particularly advantageous if the zone is comparatively thin.

The heating conductor can be embedded in the conductor support or preferably be enclosed by the conductor support. With this design of the resistance heating element, the heating conductor can be protected against fractures or breakage particularly well. Furthermore, the conductor support can be heated by the heating conductor during operation of the resistance heating element, allowing a particularly homogeneous glow distribution and thus a particularly good heat distribution to be achieved.

Also, electrical terminal pads of the heating conductor can be formed on the conductor support. The electrical terminal pads can protrude from the conductor support or be formed in a plane with a surface of the conductor support, meaning there are no projections or steps in the surface. The resistance heating element can also be coated by flame spraying in the area of the terminal pads. Via thermal spraying of powdery aluminum, the terminal pads can thus be provided with an aluminum layer that provides good electrical contact. Aluminum is easy to process by flame spraying and does not melt off the resistance heating element during operation of the resistance heating element.

The resistance heating element can be realized with a round tubular cross section and a helical heating conductor. The helical heating conductor can form a helix or a double helix, and terminal pads can be disposed at one end of the heating conductor. The resistance heating element can form a molded body in the shape of a tube having the same diameter and the same wall thickness. Air gaps for electrically separating the helical heating conductor paths are no longer required but can be present in principle.

Other advantageous embodiments of a resistance heating element are apparent from the description of features of the dependent claims referring to method claim 1.

Hereinafter, the disclosure is explained in more detail with reference to the accompanying drawings.

Figure 1:
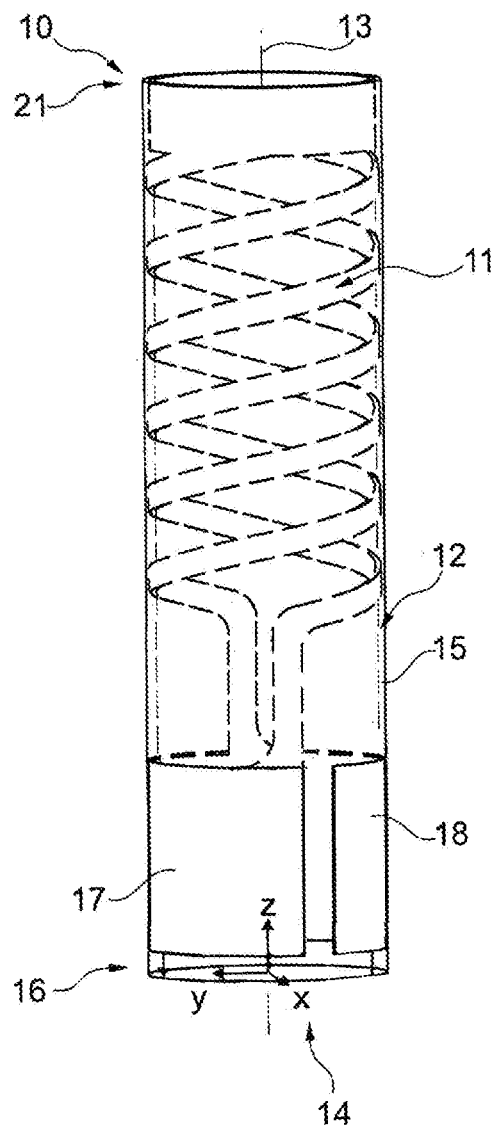
FIG. 1 is a side view of a resistance heating element.
Figure 2:
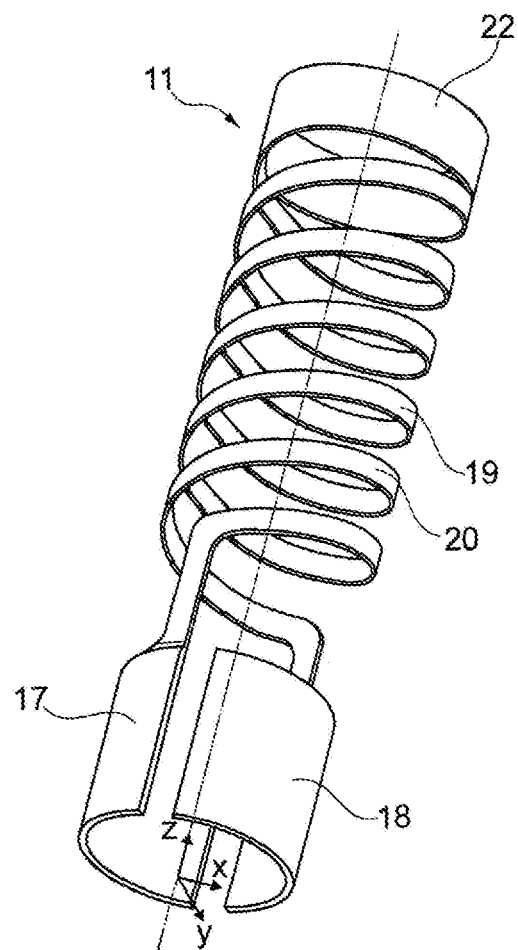
FIG. 2 is a perspective view of a heating conductor of the resistance heating element.
Figure 3:
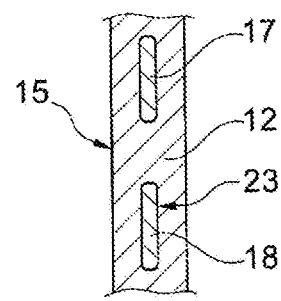
FIG. 3 is a partial sectional view of the resistance heating element of FIG. 1.

A combined view of FIGS. 1 to 3 shows a high-temperature component or resistance heating element 10 formed in one piece and consisting of a heating conductor and a conductor support 12. Resistance heating element 10 has a tubular or round, circular cross section 14 with respect to a longitudinal axis 13. A tube wall 15 of resistance heating element 10 is comparatively thin. Furthermore, two terminal pads 17 and 18 for connecting resistance heating element 10 to terminal contacts of a terminal device (not shown) of a differential scanning calorimeter are realized in the area of a lower end 16 of resistance heating element 10.

As can be seen from FIG. 2, heating conductor 11, which is shown on its own here, is realized with helical heating conductor paths 19 and 20 running within tube wall 15. Heating conductor paths 19 and 20 run from terminal pads 17 and 18, respectively, in the longitudinal direction up to an upper end 21 of resistance element 10 and meet there in the shape of a ring 22 of heating conductor 11.

FIG. 3 shows a partial sectional view through tube wall 15 along longitudinal axis 13, the illustration showing that heating conductor paths 19 and 20 run in or within tube wall 15 and thus within conductor support 12. Heating conductor 11 is formed in particular from a material mixture of a matrix material with a carbon material, and conductor support 12 is made from another material mixture of the matrix material with a silicon material, a thermoplastic being used as the matrix material and a green body being formed from the material mixture and the other material mixture simultaneously by additive manufacturing and being subsequently turned into resistance heating element 10 by means of pyrolysis. So heating conductor 11 of resistance element 10 consists essentially of carbon, and conductor support 12 consists essentially of silicon carbide. A concentration gradient can be formed in a very narrow border area 23 between heating conductor 11 and conductor support 12 because of the pyrolysis of the material mixture and the other material mixture. Furthermore, resistance heating element 10 is provided with a silicon carbide layer (not shown) which has been applied by CVD coating.

The invention claimed is:

1. A method for producing a high-temperature component comprising the following steps:

forming a dimensionally stable green body from a matrix material comprising a material mixture of thermoplastic mixed with a carbon material using additive manufacturing; and pyrolizing the green body to form a high-temperature component, wherein the high-temperature component is a resistance heating element, wherein the resistance heating element comprises a heating conductor formed from the material mixture, and wherein the matrix material further comprises another material mixture, and the step of forming a dimensionally stable green body further comprises the step of forming an electrically non-conductive conductor support accommodating the heating conductor from the other material mixture.

2. The method according to claim 1, wherein the other material mixture of the matrix material comprises a silicon material.

3. The method according to claim 2, wherein the step of forming a dimensionally stable green body comprises forming the green body with the material mixture embedded in the other material mixture.

4. The method according to claim 2, wherein the other material mixture comprises a stoichiometric mixture of matrix material and silicon material, and the step of pyrolyzing the other material mixture forms silicon carbide from the other material mixture.

5. The method according to claim 2, wherein the step of pyrolyzing the green body converts the material mixture forming the heating conductor into carbon and the other material mixture forming the conductor support into silicon carbide.

6. The method according to claim 2, wherein silicon fibers or silicon particles are used as the silicon material.

7. The method according to claim 6, wherein the fibers are discharged from a nozzle together with the matrix material and are spatially arranged.

8. The method according to claim 6, wherein the high-temperature component is realized with a fiber content of 10 vol % to 60 vol %.

9. The method according to claim 1, wherein carbon fibers, carbon black, graphite, graphene and/or carbon nanotubes are used as the carbon material.

10. The method according to claim 1, wherein the green body is formed by fused deposition modeling (FDM).

11. The method according to claim 1, wherein polyetherimide (PEI), polyether ether ketone (PEEK), polysulfone (PSU) or polyphenylene sulfone (PPSU) is used as the matrix material.

12. The method according to claim 1, wherein, after the step of pyrolyzing the green body, the high-temperature component is CVD-coated with silicon carbide after pyrolysis.

13. The method according to claim 1, further comprising the step of applying a high-temperature heat treatment after the step of pyrolyzing the green body.

* * * * *